United States Patent
Matsushita et al.

(10) Patent No.: US 12,015,098 B2
(45) Date of Patent: Jun. 18, 2024

(54) PHOTODETECTION APPARATUS

(71) Applicant: Asahi Kasei Microdevices Corporation, Tokyo (JP)

(72) Inventors: Koji Matsushita, Tokyo (JP); Yoshihiko Koizumi, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 71 days.

(21) Appl. No.: 17/645,060

(22) Filed: Dec. 20, 2021

(65) Prior Publication Data

US 2022/0209042 A1    Jun. 30, 2022

(30) Foreign Application Priority Data

Dec. 25, 2020  (JP) ................................. 2020-217103
Nov. 11, 2021  (JP) ................................. 2021-184287

(51) Int. Cl.
*H01L 31/16* (2006.01)
*H01L 31/02* (2006.01)
*H01L 31/0203* (2014.01)
*H01L 31/18* (2006.01)

(52) U.S. Cl.
CPC ...... *H01L 31/165* (2013.01); *H01L 31/02016* (2013.01); *H01L 31/0203* (2013.01); *H01L 31/18* (2013.01)

(58) Field of Classification Search
None
See application file for complete search history.

(56) References Cited

U.S. PATENT DOCUMENTS

| | | | |
|---|---|---|---|
| 2002/0105002 A1* | 8/2002 | Ono | H01L 33/483 257/E31.117 |
| 2003/0147449 A1 | 8/2003 | Chavan | |
| 2012/0228503 A1 | 9/2012 | Nishikawa | |
| 2015/0362365 A1 | 12/2015 | Fukunaka | |
| 2016/0049526 A1* | 2/2016 | Oganesian | H01L 31/0203 257/434 |
| 2016/0195432 A1* | 7/2016 | Joo | G01J 1/44 250/214 A |
| 2017/0194528 A1* | 7/2017 | Niimura | H01L 33/483 |
| 2022/0099567 A1* | 3/2022 | Fukunaka | G01J 3/0259 |

FOREIGN PATENT DOCUMENTS

| | | | | |
|---|---|---|---|---|
| JP | 2002122473 A | 4/2002 | | |
| JP | 2011174762 A | 9/2011 | | |
| JP | 6039789 B | 12/2016 | | |
| JP | 6662469 B | 3/2020 | | |
| WO | WO-2010143175 A1 * | 12/2010 | | G02B 6/4204 |

\* cited by examiner

*Primary Examiner* — Sarah K Salerno

(57) ABSTRACT

Provided is a photodetection apparatus which includes a mounting board, and an optical sensor device that includes a first surface on the mounting board side and a second surface on a side opposite to the mounting board, and is mounted on the mounting board. The optical sensor device includes an optical sensor that includes a light receiving surface on the second surface side, a signal processing circuit that is electrically connected to the optical sensor, and a lead frame that is provided on the second surface side with respect to the signal processing circuit, and shields a surface of the signal processing circuit on the second surface side. The mounting board has a conductive pattern that faces the signal processing circuit and shields a surface of the signal processing circuit on the first surface side.

18 Claims, 13 Drawing Sheets

PHOTODETECTION APPARATUS

The contents of the following Japanese patent application(s) are incorporated herein by reference:
NO. 2020-217103 filed in JP on Dec. 25, 2020
NO. 2021-184287 filed in JP on Nov. 11, 2021

BACKGROUND

1. Technical Field

The present invention relates to a photodetection apparatus.

2. Related Art

In Patent Document 1, "As illustrated in FIG. 1(a) to FIG. 1(d), the infrared sensor member 50 includes a third member 41 having a penetrating aperture h2 and a die pad 42, an IR sensor device 43 disposed in the aperture h2 of the third member 41, a signal processing IC 44 attached to one surface side (that is, the surface 41a side) of the die pad 42, a wire 45 made of gold (Au) or the like that electrically connects between the IR sensor device 43 and the third member 41, between the signal processing IC 44 and the third member 41, and between the IR sensor device 43 and the signal processing IC 44 respectively, and a mold member 46 that covers the third member 41 and the IR sensor device 43 and the signal processing IC 44 and the wire 45.

CITATION LIST

Patent Document

Patent Document 1: Japanese Patent No. 6039789

SUMMARY

In the aspect of the present invention, a photodetection apparatus is provided. The photodetection apparatus may include a mounting board. The photodetection apparatus may include an optical sensor device that includes a first surface on the mounting board side and a second surface on a side opposite to the mounting board, and is mounted on the mounting board. The optical sensor device may include an optical sensor that includes a light receiving surface on the second surface side. The optical sensor device may include a signal processing circuit that is electrically connected to the optical sensor. The optical sensor device may include a lead frame that is provided on the second surface side with respect to the signal processing circuit, and shields a surface of the signal processing circuit on the second surface side. The mounting board may have a conductive pattern that faces the signal processing circuit and shields a surface of the signal processing circuit on the first surface side.

The signal processing circuit may be disposed between the lead frame and the conductive pattern, and have a smaller area than the lead frame and the conductive pattern when viewed from the light receiving surface side.

The lead frame may include an aperture for exposing the light receiving surface of the optical sensor to an outside.

The optical sensor may be a backside light receiving type and includes a circuit surface on the mounting board side.

The optical sensor may be an infrared sensor.

The signal processing circuit may be an integrated circuit chip having a circuit surface on the mounting board side.

The lead frame may be electrically connected to the conductive pattern.

The lead frame may include a single terminal electrically connected to the conductive pattern.

The lead frame may include two or more terminals electrically connected to the conductive pattern.

The conductive pattern may be electrically connected to a ground of the mounting board.

The lead frame may include a plurality of terminals provided at least a part of a side portion of the optical sensor device at intervals of 2.85 mm or less.

The conductive pattern may be provided in a surface of the mounting board on the optical sensor device side.

The conductive pattern may be provided in at least one of an inner layer of the mounting board and a surface of the mounting board opposite to the optical sensor device.

The conductive pattern may further face the optical sensor and further shield a surface of the optical sensor on the first surface side.

The lead frame may be thicker than the conductive pattern.

The optical sensor device may have a structure in which the optical sensor, the signal processing circuit, and the lead frame are integrated by resin sealing.

The summary clause does not necessarily describe all necessary features of the embodiments of the present invention. The present invention may also be a sub-combination of the features described above.

DESCRIPTION OF EXEMPLARY EMBODIMENTS

Hereinafter, the present invention will be described through embodiments of the invention, but the following embodiments do not limit the invention according to the claims. In addition, not all combinations of features described in the embodiments are necessarily essential to the solution of the invention.

Figure 1:
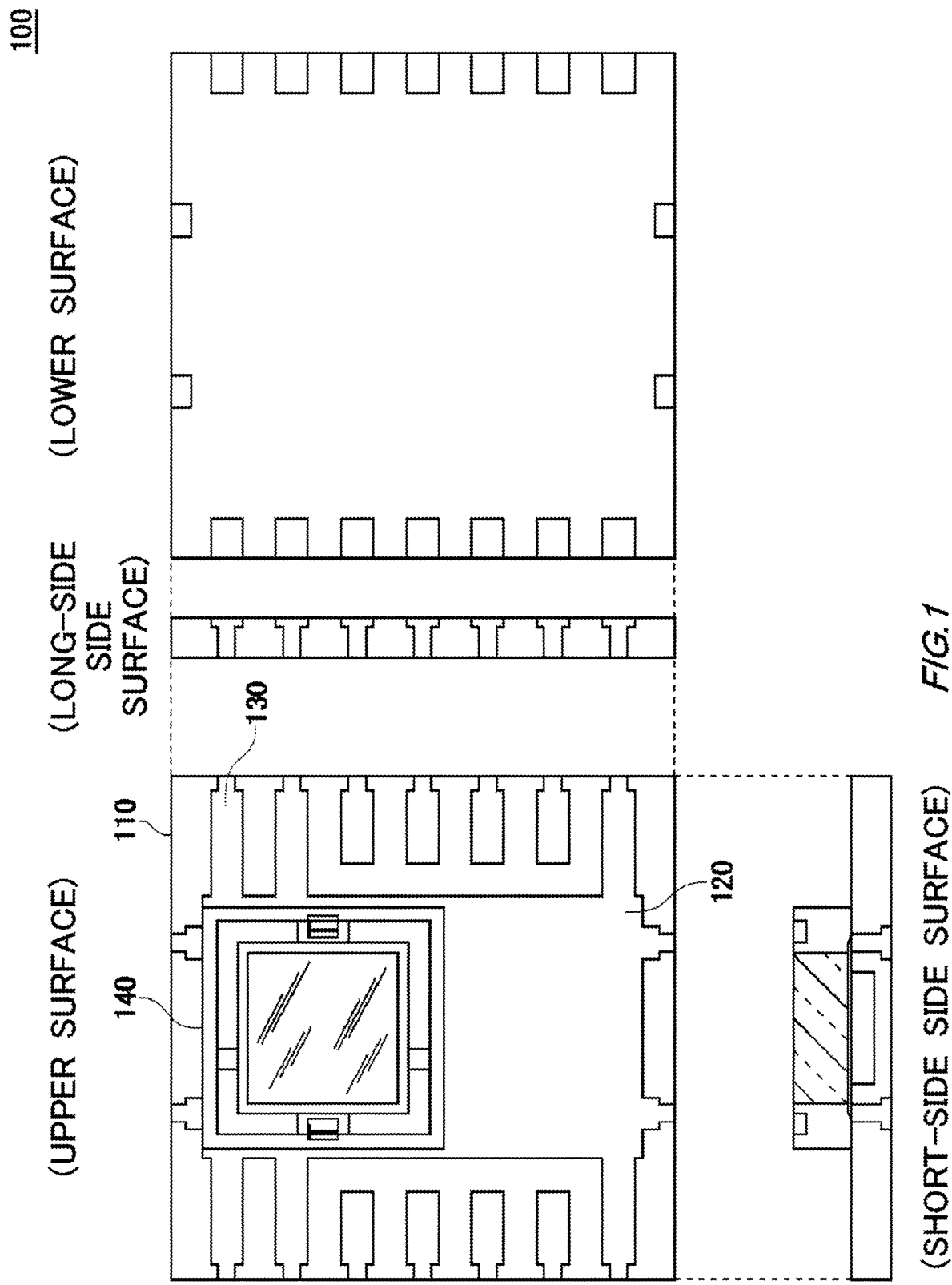
FIG. 1 illustrates the structure of an optical sensor device 100 according to the present embodiment.

FIG. 1 illustrates the structure of an optical sensor device 100 according to the present embodiment as viewed from the upper surface, the lower surface, the long-side side surface, and the short-side side surface. The optical sensor device 100 receives light and converts the light into an electric signal. In the present embodiment, the optical sensor device 100 is, for example, an infrared sensor device that receives infrared rays and converts them into electric signals. Alternatively, the optical sensor device 100 may receive light of another wavelength and convert it into an electrical signal. Here, for the convenience of explanation, the surface on the side where the optical sensor device 100 of a sensor block 110 of the optical sensor device 100 is mounted on a mounting board is referred to as a "lower surface", a "first surface", or a "mounting surface", and the surface on the side where the optical sensor device 100 or the sensor block 110 receives light is referred to as an "upper surface", a "second surface", or a "light receiving surface".

The optical sensor device 100 includes the sensor block 110 and a filter block 140. The sensor block 110 includes a lead frame 120, and incorporates an optical sensor and a signal processing circuit as illustrated in FIG. 2 and the subsequent drawings.

The lead frame 120 supports or fixes built-in devices (IC, LSI, ASIC or the like) such as an optical sensor and a signal processing circuit in the optical sensor device 100, and functions as a terminal for electrically connecting the built-in device in the optical sensor device 100 to external wirings. The lead frame 120 is formed by etching or pressing a metal plate such as copper. In the present embodiment, the lead frame 120 is exposed in the upper surface of the sensor block 110. Further, the lead frame 120 includes a plurality of terminals 130 on at least some or all side portions of the sensor block 110. Each terminal 130 is exposed from the upper surface to the side surface and the lower surface of the sensor block 110, and is connected to the terminal pattern on the mounting board in the lower surface of the sensor block 110. Some terminals 130 (in the present embodiment, two terminals each in the upper side and the lower side and the first, second, and seventh terminals counted from the top on the right side and the left side in a top view) are connected to a rectangular plate portion which is widely exposed toward the upper surface side of the sensor block 110 in the lead frame 120.

The filter block 140 is fixedly disposed above the optical sensor of the sensor block 110 on the upper surface side of the sensor block 110. The filter block 140 passes light in a wavelength band to be received by the optical sensor device 100, and filters light having a wavelength outside the band so that it does not pass through. Here, the optical sensor may be an infrared sensor as an example, and the filter block 140 may allow infrared rays to pass therethrough. Note that, in the present embodiment, the optical sensor device 100 includes the filter block 140, but the optical sensor device 100 may be configured not to include the filter block 140.

Figure 2:
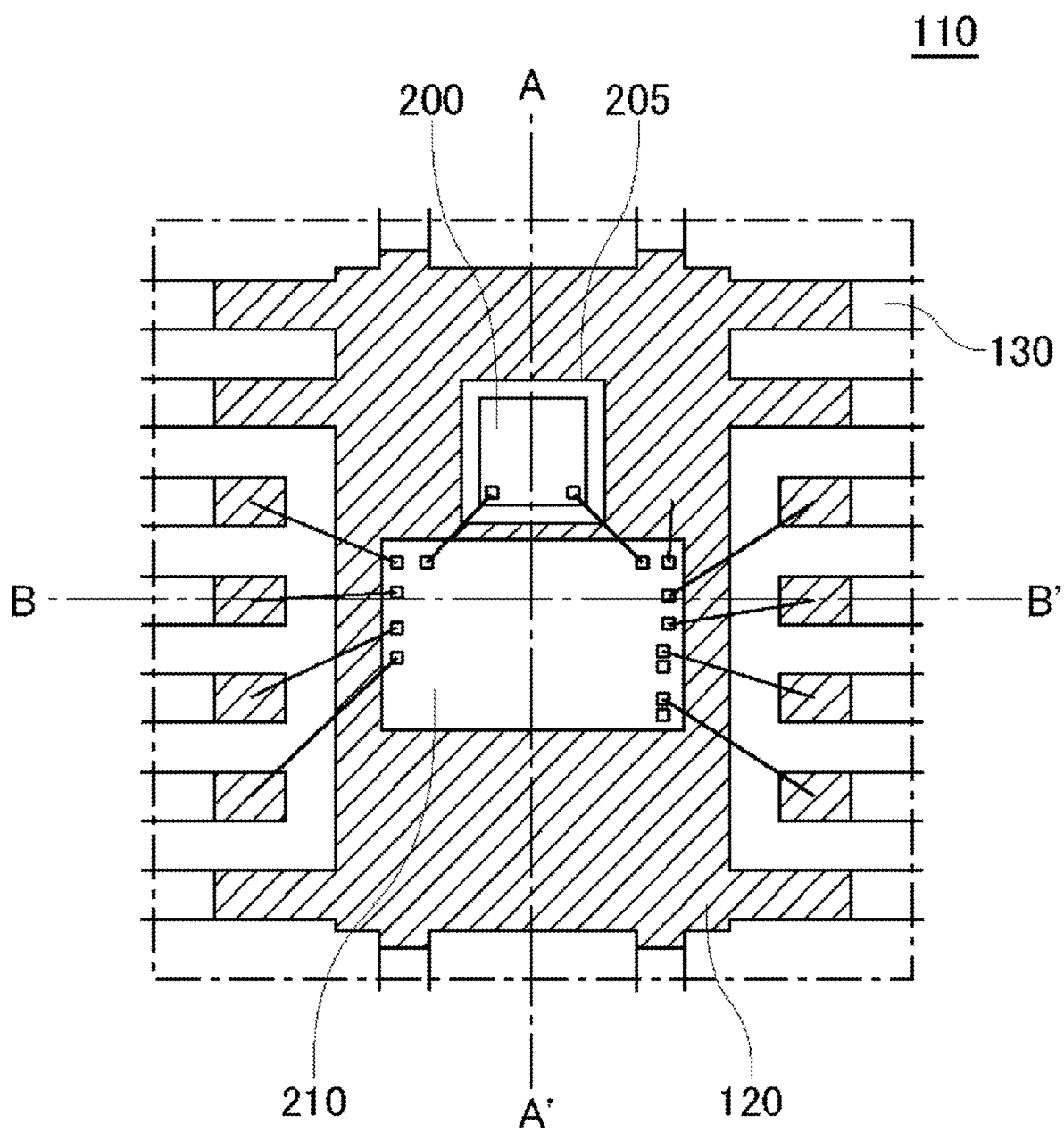
FIG. 2 illustrates the internal structure of a sensor block 110 according to the present embodiment.

FIG. 2 illustrates a diagram of the internal structure of the optical sensor device 100 according to the present embodiment as viewed from the lower surface side. The lead frame 120 has a thickness from the upper surface to the lower surface of the sensor block 110 at the portion where each terminal 130 is provided on the side portion of the sensor block 110. On the other hand, the lead frame 120 forms the bottom of the concave portion carved when viewed from the lower surface side of the sensor block 110, and includes a rectangular plate portion widely exposed on the upper surface side of the sensor block 110.

The lead frame 120 has a structure in which, a metal plate having the same thickness as the terminal 130 is partially removed by etching or the like from the mounting surface side toward the surface of the light receiving surface side, except for the portion of the terminal 130 exposed on the mounting surface so as to form the recess, and thus the rectangular plate portion thinner than the terminal 130 is formed at the bottom of the recess. The area hatched by diagonal lines in FIG. 2 indicates the concave portion carved by etching, pressing, or the like. The lead frame 120 is exposed on the upper surface side of the sensor block 110 in the area hatched by diagonal lines in the drawing, but is thinner than the portion where each terminal 130 is provided, and there is a gap between the lead frame 120 and the lower surface side of the sensor block 110.

Further, the plurality of terminals 130 in the lead frame 120 are separated by completely removing the portion between the terminals 130 by etching or the like. Of the plurality of terminals 130, for each terminal 130 that is not electrically connected to the rectangular plate portion, the terminal 130 is separated by completely removing the portion between the rectangular plate portion and the terminal 130 in the metal plate by etching or the like. In the drawing, of the plurality of terminals 130, the two terminals on the upper side and the lower side of the sensor block 110 and the first, second, and seventh terminals counted from the top on the right side and the left side are electrically connected to the above-mentioned rectangular plate portion. In the drawing, the third to sixth terminals on the right side and the left side of the sensor block 110 are separated from the rectangular plate portion.

The sensor block 110 includes an optical sensor 200 and a signal processing circuit 210. The lead frame 120 includes an aperture 205 for exposing the light receiving surface of the optical sensor 200 to the outside of the sensor block 110, and the optical sensor 200 is disposed in the aperture 205 such that the light receiving surface for receiving light faces the upper surface side in FIG. 1.

The signal processing circuit 210 is disposed in the surface on the lower surface side of the sensor block 110 in the lead frame 120. The signal processing circuit 210 is electrically connected to the optical sensor 200 and some of the plurality of terminals 130 by wire bonding or the like. The signal processing circuit 210 processes an electric signal output in response to the optical sensor 200 receiving light, and outputs, from at least one terminal 130, for example, a detection signal indicating a digital value according to the intensity of light.

As shown above, since the lead frame 120 covers the upper surface side of the signal processing circuit 210 wider than the signal processing circuit 210, the upper surface side of the signal processing circuit 210 can be shielded from external noises.

Figure 3:
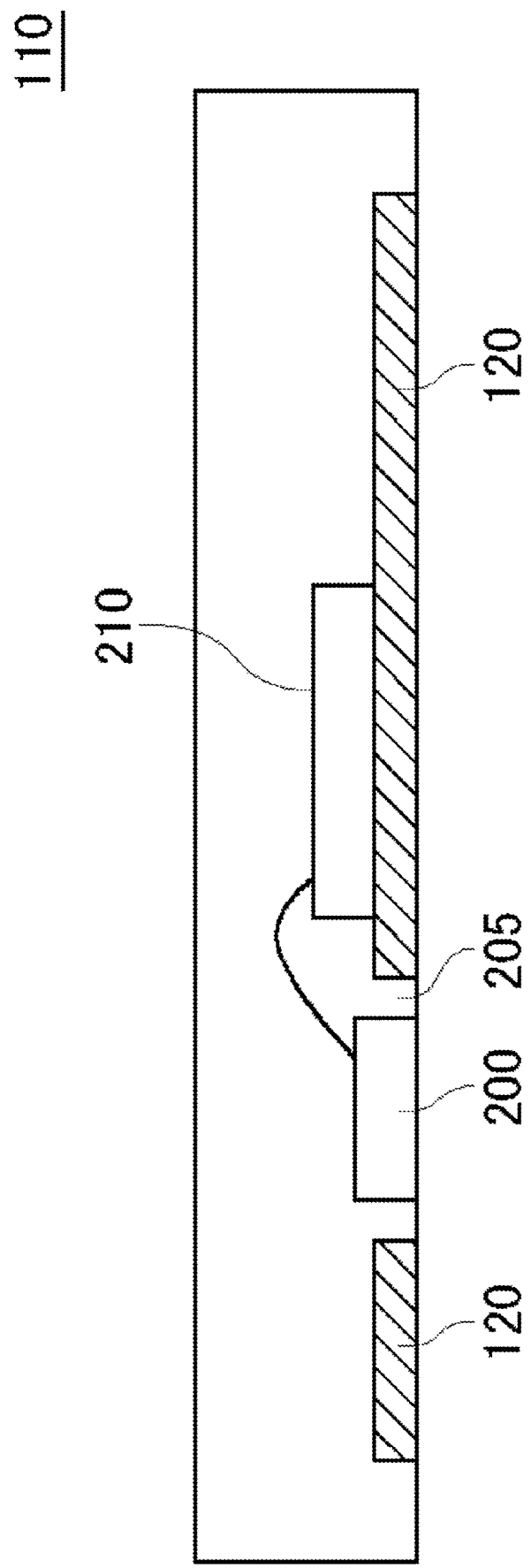
FIG. 3 is a schematic diagram of a cross section of the sensor block 110 according to the present embodiment.

FIG. 3 is a schematic diagram of a cross section of the sensor block 110 according to the present embodiment, corresponding to A-A' of FIG. 2. In this drawing, the A side of FIG. 2 is the left side of the paper surface, and the A' side is the right side of the paper surface. Further, in this drawing, the light receiving surface side of the sensor block 110 is the lower side of the paper surface, and the mounting surface side of the sensor block 110 to the mounting board is the upper side of the paper surface.

The rectangular plate portion of the lead frame 120 is exposed on the light receiving surface side of the sensor block 110. As illustrated in FIG. 2 and FIG. 3, the lead frame 120 includes the aperture 205 which is a through hole provided in the rectangular plate portion. The optical sensor 200 is disposed in the aperture 205 so that the light receiving surface is flush with the surface of the lead frame 120 on the lower side of the paper surface. In the present embodiment, the optical sensor 200 is a backside light receiving type, and includes a circuit surface on the side opposite to the light receiving surface (mounting board side), that is, on the upper side of the paper surface. The signal processing circuit 210 is disposed on the surface of the lead frame 120 on the mounting board side. In the present embodiment, the signal processing circuit 210 is an integrated circuit chip having a circuit surface on the mounting board side.

In the present embodiment, as described above, both the optical sensor 200 and the signal processing circuit 210 have a circuit surface on the mounting board side. Then, the circuit surface of the optical sensor 200 and the circuit surface of the signal processing circuit 210 are connected by wire bonding.

The manufacturing method of the optical sensor device 100 is as follows as an example. First, the metal plate is etched or pressed in the region to be included in the sensor block 110 to form the lead frame 120 having the plurality of terminals 130 and the aperture 205. Next, an adhesive tape is attached to the surface of the lead frame 120 on the lower side of the paper surface, the optical sensor 200 is disposed in the aperture 205, and the optical sensor 200 is attached and fixed to the adhesive tape.

Next, the signal processing circuit 210 is attached to the surface of the lead frame 120 on the upper side in FIG. 3 with an adhesive or an adhesive tape. Next, the optical sensor 200 and the terminals on the circuit surface of the aperture 205 are electrically connected by wire bonding. Next, the lead frame 120, the optical sensor 200, and the signal processing circuit 210 are sealed by molding. Then, the adhesive tape fixing the lead frame 120 and the optical sensor 200 is peeled off.

By using such a manufacturing method as an example, it is possible to manufacture the optical sensor device 100 having a structure in which the optical sensor 200, the signal processing circuit 210, and the lead frame 120 are integrated by resin sealing.

Figure 4:
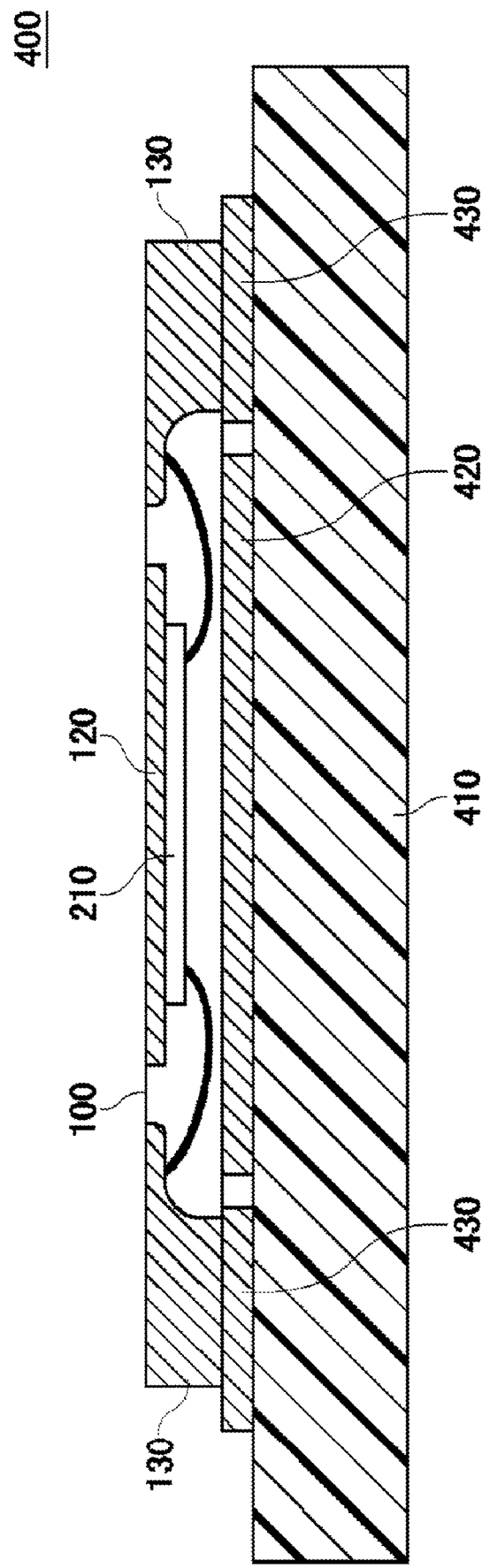
FIG. 4 is a schematic diagram of a cross section of a photodetection apparatus 400 according to the present embodiment.

FIG. 4 is a schematic diagram of a cross section of the photodetection apparatus 400 according to the present embodiment, corresponding to B-B' in FIG. 2. The photodetection apparatus 400 includes the optical sensor device 100 and the mounting board 410 on which the optical sensor device 100 is disposed. Note that, in this drawing, the filter block 140 of the optical sensor device 100 is omitted.

The optical sensor device 100 includes a mounting surface (first surface) on the mounting board 410 side and a light receiving surface (second surface) on the side opposite to the mounting board 410, and is mounted on the mounting board 410. The optical sensor device 100 includes the lead frame 120 exposed on the light receiving surface side (upper side of the paper surface in the drawing) and the signal processing circuit 210 disposed in the surface of the lead frame 120 on the mounting surface side inside a concave portion formed from the mounting surface side. The lead frame 120 is provided on the light receiving surface side with respect to the signal processing circuit 210, and shields the surface in the signal processing circuit 210 on the light receiving surface side.

The mounting board 410 supports and fixes various electronic components including the optical sensor device 100 mounted thereon. The mounting board 410 includes a wiring pattern and electrically connects electronic components. The mounting board 410 may be any kind of board in which the optical sensor device 100 can be mounted, such as a printed circuit board (PCB), a board included in each stacked package in a package-on-package (PoP), or an interposer that is inserted between an electronic device and a printed circuit board and the like to convert terminal arrangement.

The mounting board 410 has a conductive pattern 420 and one or more conductive patterns 430 on the mounting surface side of the optical sensor device 100 in the insulating board body. As an example, the conductive pattern 420 and one or more conductive patterns 430 may be formed by etching to remove a region other than a desired pattern portion in a metal thin film such as a copper foil formed on the insulating board body. The conductive pattern 420 is provided on the mounting surface side of the optical sensor device 100 in the mounting board 410 at a position facing the rectangular plate portion of the lead frame 120 and the signal processing circuit 210. The conductive pattern 420 may be provided on the surface of the mounting board 410 on the optical sensor device 100 side. The conductive pattern 420 shields the surface of the signal processing circuit 210 on the mounting surface side of the optical sensor device 100. Each of the one or more conductive patterns 430 is provided at a position facing the corresponding terminal 130 of the optical sensor device 100 and is connected to the corresponding terminal 130.

According to the photodetection apparatus 400 shown above, the signal processing circuit 210 is disposed between the lead frame 120 and the conductive pattern 420. Here, the signal processing circuit 210 has a smaller area than either the lead frame 120 or the rectangular plate portion of the lead frame 120 and the conductive pattern 420 when viewed from the light receiving surface side of the optical sensor device 100. As a result, the signal processing circuit 210 can be shielded from the outside on both the light receiving surface side and the mounting surface side of the optical sensor device 100 so as not to be affected by noise. Further, the photodetection apparatus 400 shields the surface of the optical sensor device 100 in the signal processing circuit 210 on the light receiving surface side by the lead frame 120 built in the optical sensor device 100, and shields the surface of the optical sensor device 100 in the signal processing circuit 210 on the mounting surface side by the conductive pattern 420 formed on the mounting board 410 outside the optical sensor device 100, so that the structure of the optical sensor device 100 can be simplified as compared with shielding the top and bottom of the signal processing circuit 210 in the optical sensor device 100.

As illustrated in FIG. 1 and FIG. 2, the optical sensor device 100 is provided with the plurality of terminals 130 separated from each other, but it is noted that, even in such a configuration, it is possible to block or sufficiently reduce noises from the side surface in which the interval between the terminals becomes ½ or less of the wavelength. Therefore, the plurality of terminals 130 included in at least a part of the side portions of the lead frame 120 may be provided at intervals of 2.85 mm or less. As a result, the optical sensor device 100 can block or sufficiently reduce noises in a band having a wavelength of two times 2.85 mm or less, that is, 52.6 GHz or less used for communication.

Further, the photodetection apparatus 400 does not adopt a structure in which an optical sensor device where a lead frame is disposed on the mounting surface side and a signal processing circuit is disposed on the light receiving surface side of the lead frame is used, and the light receiving surface side is covered with a conductive lid or a conductive tape except the aperture for the optical sensor, but adopts the lead frame 120 and the conductive pattern 420 of the mounting board 410 to form a shield. Therefore, the photodetection apparatus 400 can form a shield in a process where the optical sensor device 100 is mounted on the mounting board 410 having the conductive pattern 420 and mounted by reflowing without using the optical sensor device in which both the light receiving surface side and the mounting surface side are shielded.

Figure 5:
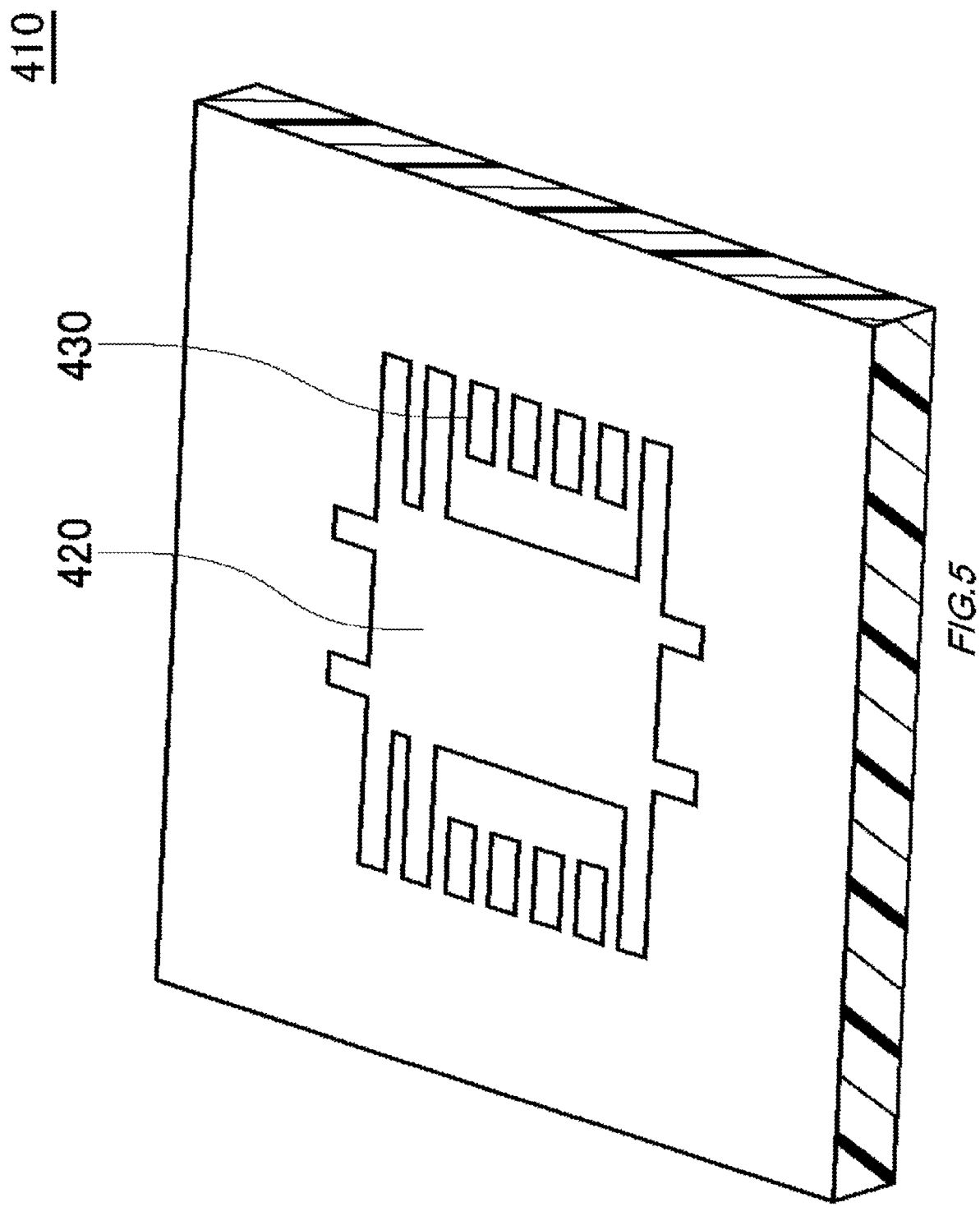
FIG. 5 is a perspective view of a mounting board 410 according to the present embodiment.
Figure 6:
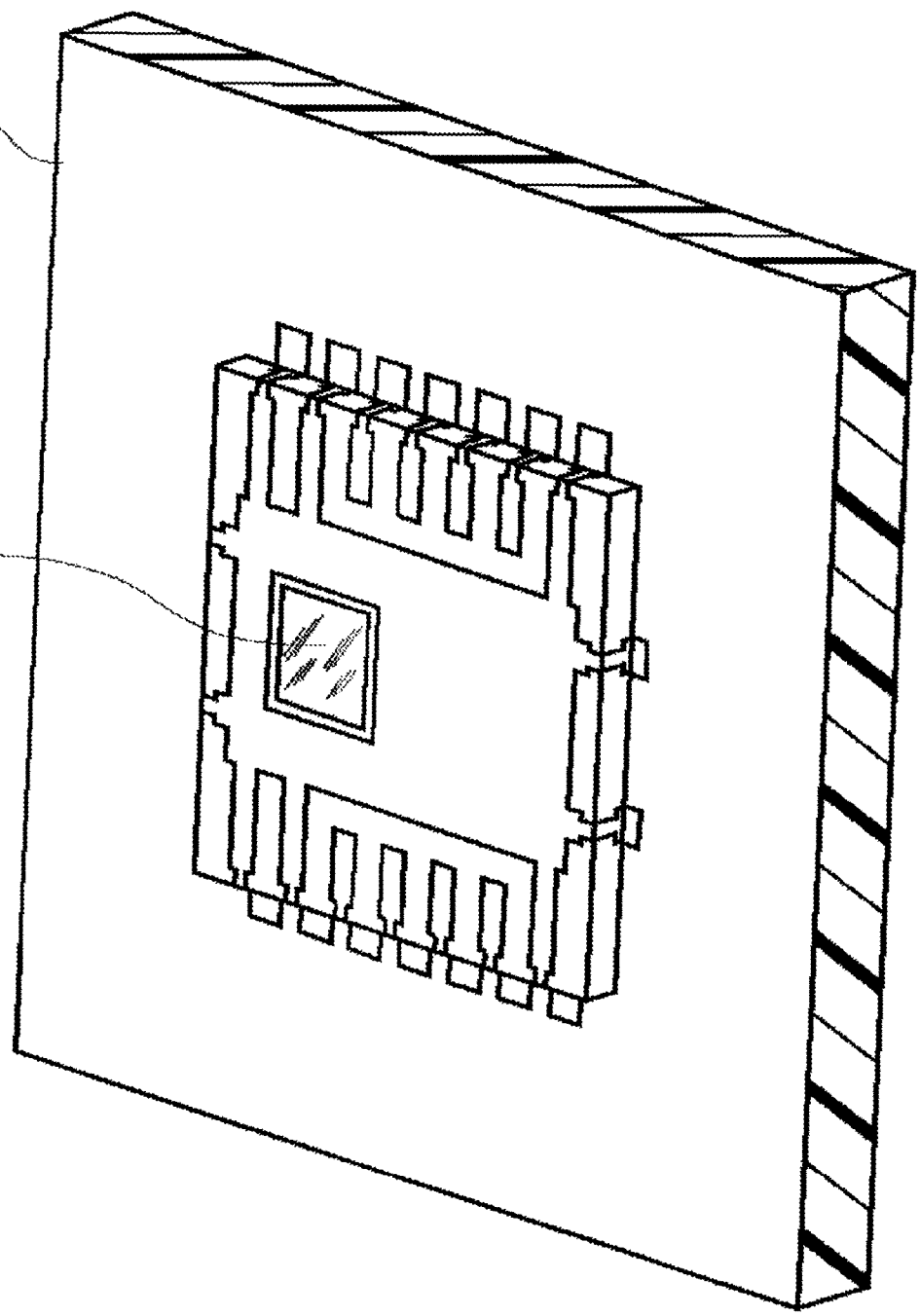
FIG. 6 is a perspective view of the photodetection apparatus 400 according to the present embodiment.

FIG. 5 is a perspective view of the mounting board 410 according to the present embodiment, and FIG. 6 is a perspective view of the photodetection apparatus 400 according to the present embodiment. In the present embodiment, the conductive pattern 420 and one or more conductive patterns 430 are formed on the mounting surface side of the optical sensor device 100 in the board body of the mounting board 410. The conductive pattern 420 includes a rectangular plate portion of the lead frame 120 and a rectangular pattern facing the signal processing circuit 210. As illustrated in FIG. 5 and FIG. 6, the conductive pattern 420 may further face the optical sensor 200 and further shield the surface of the optical sensor 200 on the mounting board 410 side (first surface side).

As illustrated in FIG. 5, the conductive pattern 420 may have at least one terminal pattern connected to at least one terminal (ground terminal or the like) included in the optical sensor device 100. As illustrated in FIG. 6, in the optical sensor device 100, each terminal 130 may be connected to the conductive pattern 430 which is a corresponding terminal pattern on the photodetection apparatus 400.

In the photodetection apparatus 400 according to the present embodiment, the lead frame 120 may be electrically connected to the conductive pattern 420 via at least one terminal 130. Here, the conductive pattern 420 may have a predetermined potential, and the rectangular plate portion of the lead frame 120 may be connected to the conductive pattern 420 to have substantially the same potential as the conductive pattern 420. For example, the conductive pattern 420 may be electrically connected to the ground of the mounting board 410, and the rectangular plate portion of the lead frame 120 and the conductive pattern 420 may be ground potentials. Further, the rectangular plate portion of the lead frame 120 and the conductive pattern 420 may be a power source potential or an intermediate potential between the ground and the power source potential. Alternatively, the rectangular plate portion of the lead frame 120 and the conductive pattern 420 may be connected to different fixed potentials (for example, the ground potential and the power source potential). Further, at least one of the rectangular plate portion of the lead frame 120 and the conductive pattern 420 is not connected to a fixed potential and may have a floating potential.

Figure 7:
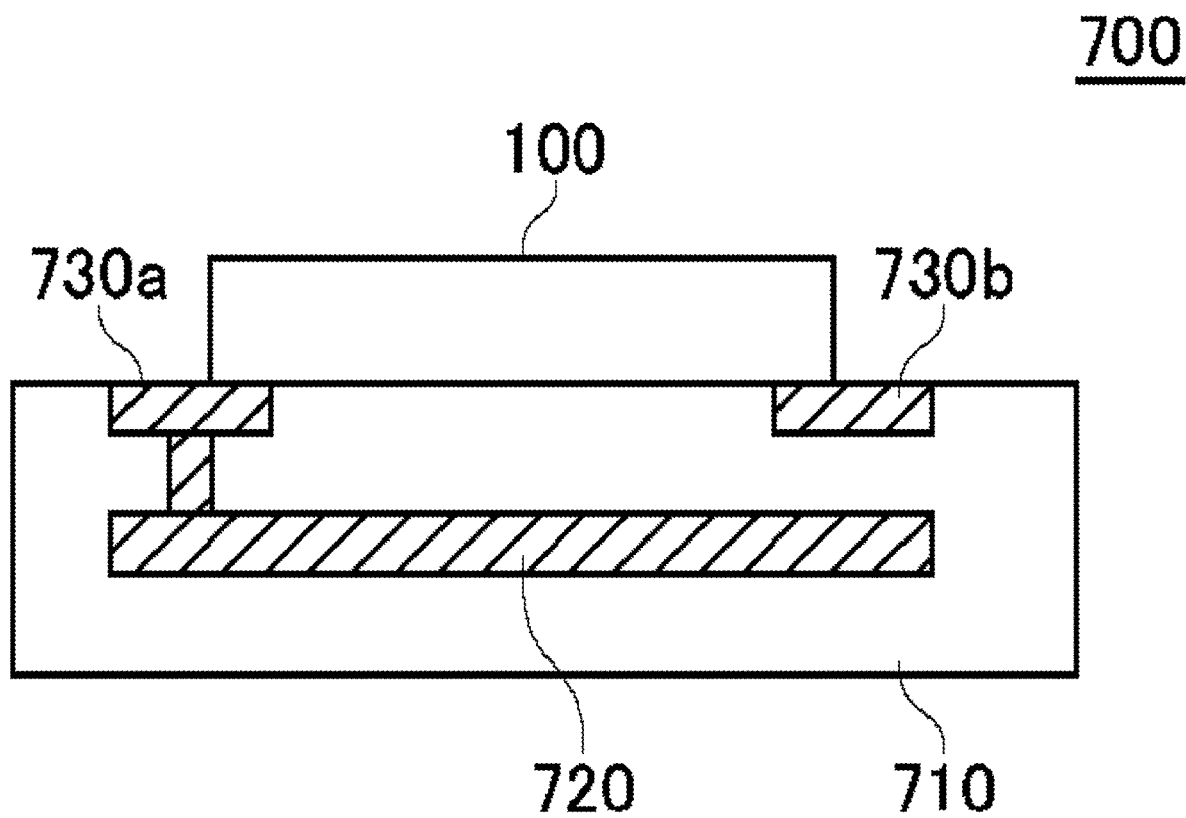
FIG. 7 illustrates the structure of a photodetection apparatus 700 according to a first modification of the present embodiment.

FIG. 7 illustrates the structure of a photodetection apparatus 700 according to a first modification of the present embodiment. In this modification, the photodetection apparatus 700 has a configuration in which the optical sensor device 100 illustrated in FIG. 1 to FIG. 3 is mounted on a mounting board 710 instead of the mounting board 410 illustrated in FIG. 4 to FIG. 6.

The mounting board 710 has a conductive pattern 720 corresponding to the conductive pattern 420 in the mounting board 410, and conductive patterns 730a and 730b corresponding to the conductive pattern 430. Hereinafter, the differences of the conductive patterns 720 and the conductive patterns 730a and 730b with respect to the conductive patterns 420 and the conductive pattern 430 will be described, and the common points with the conductive pattern 420 and the conductive pattern 430 will be omitted.

The conductive pattern 720 is provided in the inner layer of the mounting board 710, not in the surface of the mounting board 710 on the optical sensor device 100 side. Even in a case where the conductive pattern 720 is provided in the inner layer of the mounting board 710, the conductive pattern 720 can widely cover and shield the surface of the optical sensor device 100 in the signal processing circuit 210 on the mounting surface side. Alternatively or additionally, the conductive pattern 720 may be provided in the surface of the mounting board 710 opposite to the optical sensor device 100.

In the example of this drawing, the mounting board 710 has one or more conductive patterns 730a and 730b corresponding to at least one terminal 130 connected to the rectangular plate portion of the lead frame 120 among the plurality of terminals 130 included in the optical sensor device 100. As illustrated in this drawing, the conductive pattern 720 may be connected to at least one conductive pattern 730a via a conductive via. Further, the conductive pattern 720 may be formed so that the conductive patterns face each other with respect to at least one conductive pattern 730b, and is electrically coupled to the conductive pattern 730b by a capacitive coupling (parasitic capacitor).

Figure 8:
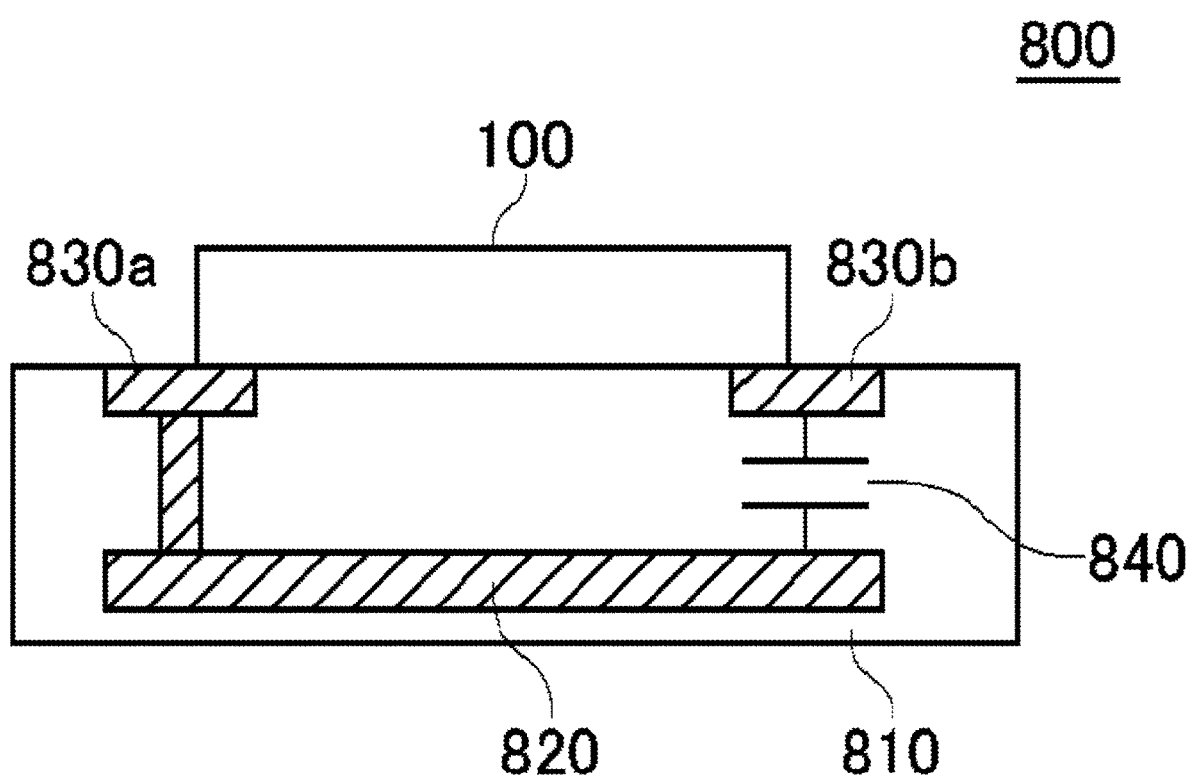
FIG. 8 illustrates the structure of a photodetection apparatus 800 according to a second modification of the present embodiment.

FIG. 8 illustrates the structure of a photodetection apparatus 800 according to a second modification of the present embodiment. In this modification, the photodetection apparatus 800 has a configuration in which the optical sensor device 100 illustrated in FIG. 1 to FIG. 3 is mounted on a mounting board 810 instead of the mounting board 710 illustrated in FIG. 7.

The mounting board 810 includes a conductive pattern 820 corresponding to the conductive pattern 720 in the mounting board 710, and conductive patterns 830a and 830b corresponding to the conductive patterns 730a and 730b. Hereinafter, the differences of the conductive patterns 820 and the conductive patterns 830a and 830b with respect to the conductive patterns 720 and the conductive patterns 730a and 730b will be described, and the common points to the conductive pattern 720 and the conductive patterns 730a and 730b will be omitted.

The conductive pattern 820 is provided in the inner layer of the mounting board 810. The conductive pattern 820 widely covers and shields the surface of the signal processing circuit 210 on the mounting surface side of the optical sensor device 100. In the example of this drawing, the mounting board 810 has one or more conductive patterns 830a and 830b corresponding to the terminal 130 connected to the rectangular plate portion of the lead frame 120 among the plurality of terminals 130 included in the optical sensor device 100. As illustrated in this drawing, the conductive pattern 820 may be connected to at least one conductive pattern 830a via a conductive via. Further, the conductive pattern 820 may be formed in the inner layer of the mounting board 810 with respect to at least one conductive pattern 830b, or may be connected to the conductive pattern 830b via an electronic component such as a capacitor 840 mounted on the mounting board 810. Such electronic components may be other electronic components such as resistors or coils.

Figure 9:
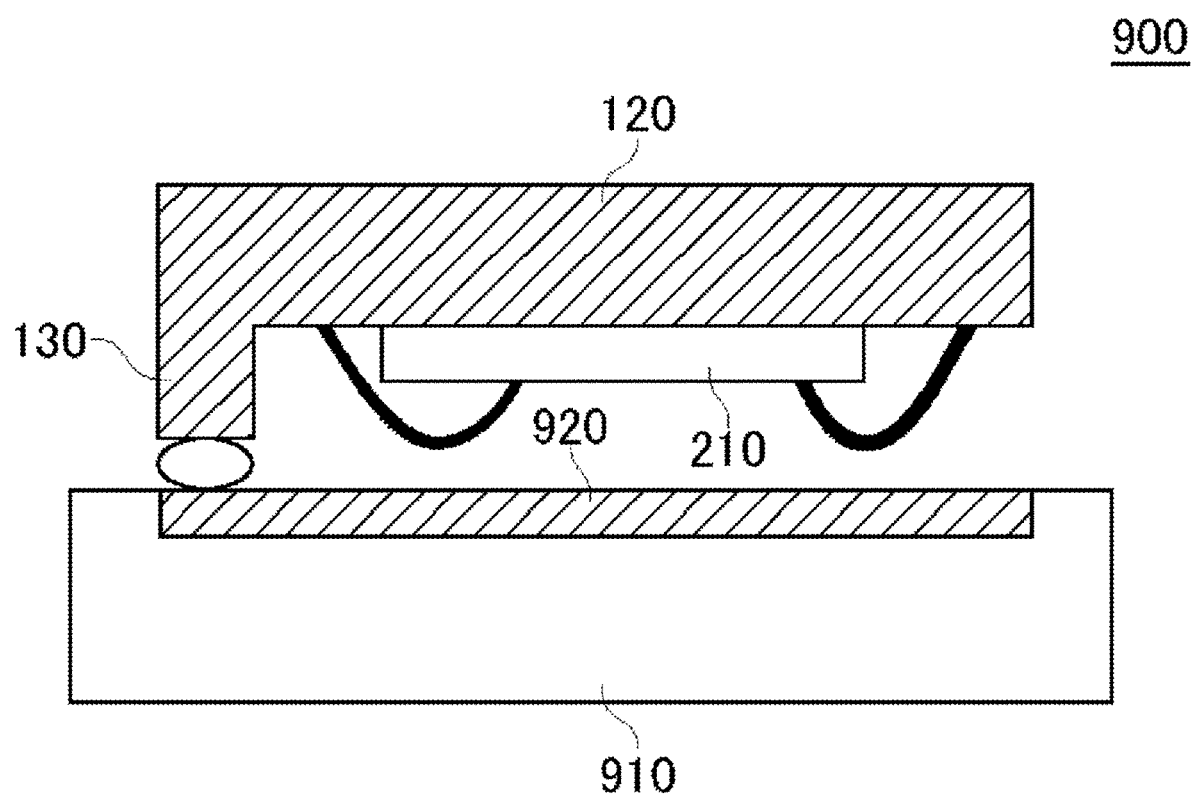
FIG. 9 illustrates the structure of a photodetection apparatus 900 according to a third modification of the present embodiment.

FIG. 9 illustrates the structure of a photodetection apparatus 900 according to a third modification of the present embodiment. In this modification, the photodetection apparatus 900 has a configuration in which the optical sensor device 100 illustrated in FIG. 1 to FIG. 3 is mounted on a mounting board 910 instead of the mounting board 410 illustrated in FIG. 4 to FIG. 6.

The mounting board 910 has a conductive pattern 920 corresponding to the conductive pattern 420 in the mounting board 410. Hereinafter, the differences between the conductive pattern 920 and the conductive pattern 420 will be described, and the common points with the conductive pattern 420 will be omitted.

In this modification, the lead frame 120 includes a single terminal 130 that is electrically connected to the conductive pattern 920, and the rectangular plate portion of the lead frame 120 is connected to the conductive pattern 920 via the terminal 130. The conductive pattern 920 may be connected to a fixed potential such as a ground in the same manner as the conductive pattern 420.

In the photodetection apparatus 900 according to this modification, the lead frame 120 is connected to the conductive pattern 920 at one point. Therefore, the photodetection apparatus 900 does not have a loop structure that can generate resonance like a ground loop, and can stabilize the fixed potential.

Figure 10:
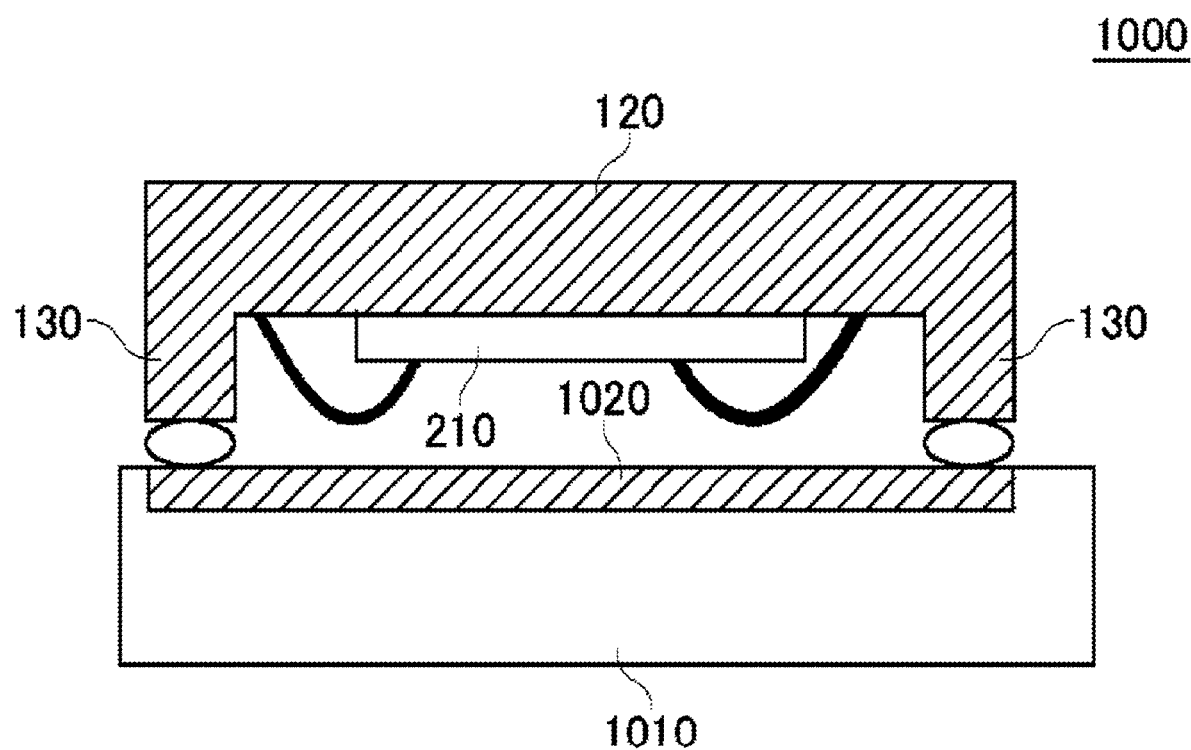
FIG. 10 illustrates the structure of a photodetection apparatus 1000 according to a fourth modification of the present embodiment.

FIG. 10 illustrates the structure of a photodetection apparatus 1000 according to a fourth modification of the present embodiment. In this modification, the photodetection apparatus 1000 has a configuration in which the optical sensor device 100 illustrated in FIG. 1 to FIG. 3 is mounted on a mounting board 1010 instead of the mounting board 410 illustrated in FIG. 4 to FIG. 6.

The mounting board 1010 has a conductive pattern 1020 corresponding to the conductive pattern 420 in the mounting board 410. Hereinafter, the differences between the conductive pattern 1020 and the conductive pattern 420 will be described, and the common points with the conductive pattern 420 will be omitted.

In this modification, the lead frame 120 includes two or more terminals 130 that are electrically connected to the conductive pattern 1020, and the rectangular plate portion of the lead frame 120 is connected to the conductive pattern 1020 via these two or more terminals 130. In the example of this drawing, two or more terminals 130 located on two opposite sides in the optical sensor device 100 are connected to the conductive pattern 1020. The conductive pattern 1020 may be connected to a fixed potential such as a ground in the same manner as the conductive pattern 420.

In the photodetection apparatus 1000 according to this modification, the rectangular plate portion of the lead frame 120 is connected to the conductive pattern 1020 at two or more points to form a loop structure such as a ground loop. On the other hand, since the rectangular plate portion of the lead frame 120 is connected to the conductive pattern 1020 at multiple points, the photodetection apparatus 1000 can further stabilize the potential of the rectangular plate portion of the lead frame 120 in a case where the fixed potential of the conductive pattern 1020 is sufficiently suppressed from fluctuation.

Figure 11:
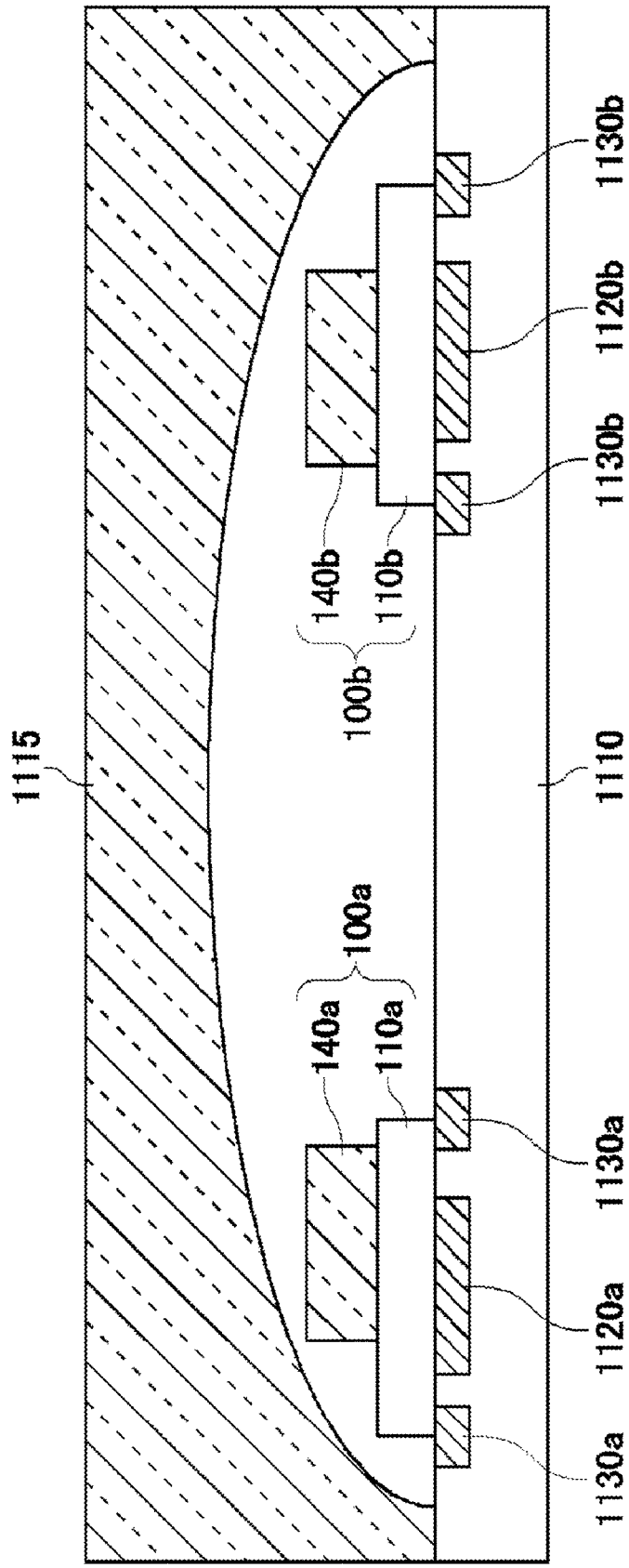
FIG. 11 illustrates the structure of a photodetection apparatus 1100 according to the present embodiment.

FIG. 11 illustrates the structure of a photodetection apparatus 1100 according to the present embodiment. As an example, the photodetection apparatus 1100 may be a gas component detection device using light such as an alcohol detection device as an example. The photodetection apparatus 1100 includes a plurality of optical sensor devices 100a and 100b, a mounting board 1110, and a cover 1115. In the present embodiment, the optical sensor device 100a includes a sensor block 110a and a filter block 140a, and the optical sensor device 100b includes a sensor block 110b and a filter block 140b. Each of the optical sensor devices 100a and 100b is the same as the optical sensor devices 100 illustrated in FIG. 1 to FIG. 3 except that the wavelength bands through which the light passes in the filter block 140a and the filter block 140b are different from each other, and thus the description will be omitted except for the following differences.

The mounting board 1110 mounts a plurality of optical sensor devices 100a and 100b (also referred to as "optical sensor device 100"). The mounting board 1110 has a conductive pattern 1120a and one or more conductive patterns 1130a for mounting the optical sensor device 100a, and a conductive pattern 1120b and one or more conductive patterns 1130b for mounting the optical sensor device 100b. Here, the mounting board 1110 corresponds to the mounting board 410 illustrated in FIG. 4 to FIG. 6, and the conductive patterns 1120a and 1120b (also referred to as "conductive pattern 1120") are the same as the conductive pattern 420, and the conductive patterns 1130a and 1130b (also referred to as "conductive pattern 1130") are the same as the conductive pattern 430, and thus the description thereof will be omitted except for the following differences.

The cover 1115 is provided in the mounting surface side of the plurality of optical sensor devices 100a and 100b in the mounting board 1110 and covers the plurality of optical sensor devices 100a and 100b. The cover 1115 may include an aperture for taking in outside air in the space between the cover 1115 and the optical sensor devices 100a and 100b.

The photodetection apparatus 1100 detects light generated from an infrared light source (not illustrated) by the optical sensor device 100a and the optical sensor device 100b. Here, the optical sensor device 100a includes the filter block 140a that selectively passes one of the infrared absorption bands through which the gas to be detected is absorbed, and the optical sensor device 100b includes the filter block 140b that selectively passes another one of the infrared absorption bands through which the gas to be detected is absorbed. Therefore, in the optical sensor devices 100a and 100b, when the concentration of the gas to be detected becomes high, the output value of the detection signal indicating the light intensity is lowered.

The detection circuit (not illustrated) mounted on the mounting board 1110 detects the presence of a gas to be detected according to the fact that each detection signal from the optical sensor devices 100a and 100b is equal to or less than a corresponding threshold value. According to the photodetection apparatus 1100 according to the present embodiment, for each of the plurality of optical sensor devices 100, the signal processing circuit 210 is provided between the lead frame 120 on the light receiving surface side of the optical sensor device 100 and the conductive pattern 1120 of the mounting board 1110, so that it is possible to prevent external noises from being applied to the signal processing circuit 210.

Figure 12:
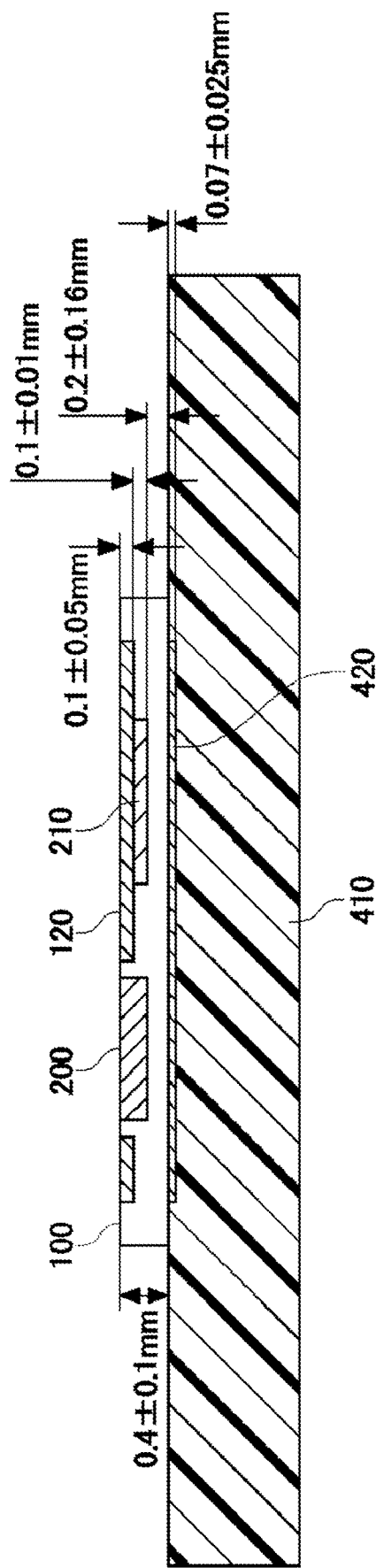
FIG. 12 illustrates an example of the thickness of each part of the photodetection apparatus 400 according to the present embodiment.

FIG. 12 illustrates an example of the thickness of each part of the photodetection apparatus 400 according to the present embodiment. Here, FIG. 12 illustrates an example of the thickness of each part on the schematic diagram of the cross section of the photodetection apparatus 400 according to the present embodiment, corresponding to A-A' in FIG. 2.

In the example of this drawing, the optical sensor device 100 has a thickness of 0.4±0.1 mm. The signal processing circuit 210 has a thickness of 0.1 mm±0.01 mm. The lead frame 120 has a thickness of 0.1 mm±0.05 mm. The distance between the surface of the signal processing circuit 210 on the mounting board 410 side and the first surface of the optical sensor device 100 is a distance obtained by subtracting the thickness of the lead frame 120 and the signal processing circuit 210 from the thickness of the optical sensor device 100, and is 0.2±0.16 mm in the example of the drawing.

By having the cross-sectional structure illustrated in this drawing, the signal processing circuit 210 is in contact with the lead frame 120 that functions as an electromagnetic shield on the second surface side of the optical sensor device 100 and, also on the first surface side of the optical sensor device 100, can be disposed at a position where the distance from the conductive pattern 420 that functions as a shield is as small as possible. As a result, the optical sensor device 100 can more effectively block electromagnetic waves from the outside as compared with the case where the shield is formed by using a conductive lid, a conductive tape, or the like.

Further, as illustrated in this drawing, the lead frame 120 may be thicker than the conductive pattern 420. Such an optical sensor device 100 can more effectively block electromagnetic noises from the light receiving surface side of the optical sensor 200 than electromagnetic noises from the side opposite to the light receiving surface of the optical sensor 200. As a result, the optical sensor device 100 can effectively block electromagnetic noises from the source side of the light to be detected, and can detect the light to be detected more accurately.

For example, in a case where the optical sensor device 100 is used in an NDIR (Non-Dispersive Infrared) type gas sensor, an infrared light source that outputs infrared light is disposed on the light receiving surface side of the optical sensor 200. The infrared light source may be driven by a pulse drive circuit that operates on a square wave. By making the lead frame 120 thicker than the conductive pattern 420, the optical sensor device 100 can more effectively block electromagnetic noises from the drive circuit of such an infrared light source.

Figure 13:
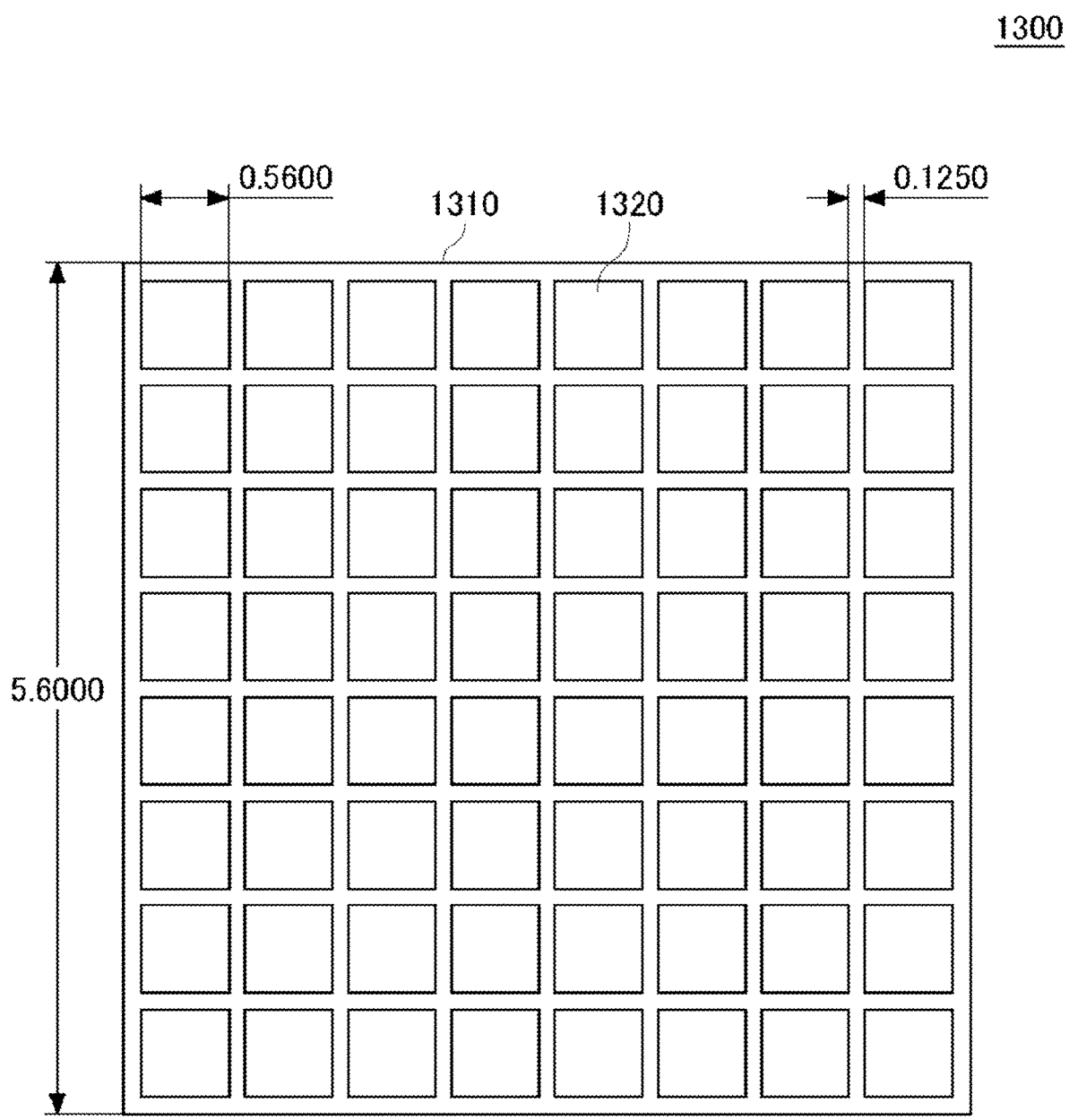
FIG. 13 illustrates a plate structure 1300 according to a fifth modification of the present embodiment.

FIG. 13 illustrates a plate structure 1300 according to a fifth modification of the present embodiment. At least one of the lead frame 120, the conductive pattern 420, the conductive pattern 720, the conductive pattern 820, the conductive pattern 920, and the conductive pattern 1020 may be a conductive plate 1310 in which a plurality of apertures 1320 are provided as illustrated in this drawing instead of being a conductive plate having no aperture.

In the example of this drawing, the plurality of apertures 1320 are disposed in a mesh shape in the surface of the conductive plate 1310. In the example of this drawing, the conductive plate 1310 has a structure in which 0.5600 mm square apertures 1320 are arranged in an area of a 5.6000 mm square in which a conductive frame having a width of 0.1250 mm is disposed between adjacent apertures 1320. Instead, the plurality of apertures 1320 may be disposed in a honeycomb shape in the surface of the conductive plate 1310, may be disposed randomly, or may be disposed at any other position. Further, although each aperture 1320 has a square shape in the example of this drawing, it may have an oblong shape, a triangular shape, a hexagonal shape, a circular shape, or any other shape instead. The area of the lead frame 120 or the conductive pattern 420 provided with the plurality of apertures 1320 is represented by the area of the entire region within the outer shape of the conductive plate 1310 including the plurality of apertures 1320.

Even in a case where the conductive plate 1310 is used as the lead frame 120, the conductive pattern 420, or the like, the optical sensor device 100 can block electromagnetic waves from the outside at least partially. The smaller the aperture ratio of the conductive plate 1310 (the ratio of the area of the aperture portion to the area of the conductive plate 1310), the higher the blocking ratio of electromagnetic waves by the conductive plate 1310. In a case where the conductive plate 1310 is used as the lead frame 120, the conductive pattern 420, or the like, the aperture ratio may be 90% or less, more preferably 64% or less.

By using the conductive plate 1310 as the lead frame 120, the conductive pattern 420, or the like, the cost of the conductive material can be reduced instead of reducing the shielding effect of electromagnetic waves. Therefore, by increasing the aperture ratio of the conductive plate 1310 within the range in which the required shielding effect can be obtained, it is possible to reduce the weight or cost of the optical sensor device 100.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

100: optical sensor device
110: sensor block
120: lead frame
130: terminal
140: filter block
200: optical sensor
205: aperture
210: signal processing circuit
400: photodetection apparatus
410: mounting board
420: conductive pattern
430: conductive pattern
700: photodetection apparatus
710: mounting board
720: conductive pattern
730: conductive pattern
800: photodetection apparatus
810: mounting board
820: conductive pattern
830: conductive pattern
840: capacitor
900: photodetection apparatus
910: mounting board
920: conductive pattern
1000: photodetection apparatus
1010: mounting board
1020: conductive pattern
1100: photodetection apparatus
1110: mounting board
1115: cover
1120: conductive pattern
1130: conductive pattern 1300: plate structure
1310: conductive plate
1320: aperture

What is claimed is:

1. A photodetection apparatus, comprising:
a mounting board; and
an optical sensor device that includes a first surface on the mounting board side and a second surface on a side opposite to the mounting board, the optical sensor device being mounted on the mounting board in a planar direction, the mounting board being directly connected or adhered to the optical sensor device, and the mounting board and the optical sensor device being overlapped in the planar direction, wherein
the optical sensor device includes:
an optical sensor that includes a light receiving surface on the second surface of the optical sensor device;
a signal processing circuit that is electrically connected to the optical sensor; and
a lead frame that is provided on the second surface of the optical sensor device with respect to the signal processing circuit, and shields a surface of the signal processing circuit on the second surface of the optical sensor device,
the mounting board has a conductive pattern that faces the signal processing circuit and shields a surface of the signal processing circuit on the side of the first surface of the optical sensor device,
the lead frame includes an aperture for exposing the light receiving surface of the optical sensor to an outside,
the lead frame and the optical sensor are not overlapped with each other in the planar direction,
the lead frame and the signal processing circuit are overlapped with each other in the planar direction, and/or the optical sensor and the signal processing circuit are not overlapped with each other in the planar direction, and
the lead frame is electrically connected to the conductive patter of the mounting board and entirely surrounds the optical sensor or the signal processing circuit.

2. The photodetection apparatus according to claim 1, wherein the signal processing circuit is disposed between the lead frame and the conductive pattern, and has a smaller area than the lead frame and the conductive pattern in the planar direction.

3. The photodetection apparatus according to claim 2, wherein the optical sensor is a backside light receiving type and includes a circuit surface on a side facing the mounting board.

4. The photodetection apparatus according to claim 2, wherein the optical sensor is an infrared sensor.

5. The photodetection apparatus according to claim 2, wherein the signal processing circuit is an integrated circuit chip having a circuit surface on a side facing the mounting board.

6. The photodetection apparatus according to claim 1, wherein the optical sensor is a backside light receiving type and includes a circuit surface on a side facing the mounting board.

7. The photodetection apparatus according to claim 1, wherein the optical sensor is an infrared sensor.

8. The photodetection apparatus according to claim 1, wherein the signal processing circuit is an integrated circuit chip having a circuit surface on a side facing the mounting board.

9. The photodetection apparatus according to claim 1, wherein the lead frame is electrically connected to the conductive pattern.

10. The photodetection apparatus according to claim 9, wherein the lead frame includes a single terminal electrically connected to the conductive pattern.

11. The photodetection apparatus according to claim 9, wherein the lead frame includes two or more terminals electrically connected to the conductive pattern.

12. The photodetection apparatus according to claim 1, wherein the conductive pattern is electrically connected to a ground of the mounting board.

13. The photodetection apparatus according to claim 1, wherein the lead frame includes a plurality of terminals provided on at least a part of a side portion of the optical sensor device at intervals of 2.85 mm or less.

14. The photodetection apparatus according to claim 1, wherein the conductive pattern is provided in a surface of the mounting board on a side facing the optical sensor device.

15. The photodetection apparatus according to claim 1, wherein the conductive pattern is provided in at least one of an inner layer of the mounting board and a surface of the mounting board opposite to the optical sensor device.

16. The photodetection apparatus according to claim 1, wherein the conductive pattern further faces the optical sensor and further shields a surface of the optical sensor on the first surface of the optical sensor device.

17. The photodetection apparatus according to claim 1, wherein the lead frame is thicker than the conductive pattern.

18. The photodetection apparatus according to claim 1, wherein the optical sensor device has a structure in which the optical sensor, the signal processing circuit, and the lead frame are integrated by resin sealing.

* * * * *